United States Patent
Kaufman et al.

(10) Patent No.: US 8,466,752 B2
(45) Date of Patent: Jun. 18, 2013

(54) SYSTEM AND METHOD FOR SUPPORTING DIFFERENT TYPES OF OSCILLATOR CIRCUITS

(75) Inventors: Kristopher Kevin Kaufman, Gilbert, AZ (US); John Wayne Simmons, Tamarac, FL (US)

(73) Assignee: Fujitsu Semiconductor Limited, Yokohama-shi (JP)

( * ) Notice: Subject to any disclaimer, the term of this patent is extended or adjusted under 35 U.S.C. 154(b) by 166 days.

(21) Appl. No.: 13/100,656

(22) Filed: May 4, 2011

(65) Prior Publication Data
US 2012/0280842 A1 Nov. 8, 2012

(51) Int. Cl.
*H03B 5/36* (2006.01)
*H03B 5/02* (2006.01)

(52) U.S. Cl.
USPC .......... 331/59; 331/46; 331/49; 331/116 FE; 331/177 R

(58) Field of Classification Search
CPC ..... H03B 5/30; H03B 5/32; H03B 5/36; H03B 5/364; H03B 5/08; H03B 5/12; H03B 5/1237
USPC .......... 33/46, 49, 59, 116 R, 116 FE, 117 R, 33/117 FE, 177 R
See application file for complete search history.

(56) References Cited

U.S. PATENT DOCUMENTS

| | | | | |
|---|---|---|---|---|
| 5,065,042 | A | 11/1991 | Thomsen et al. | 307/269 |
| 5,151,613 | A | 9/1992 | Satou et al. | 307/243 |
| 5,369,377 | A | 11/1994 | Benhamida | 331/49 |
| 6,580,332 | B2 | 6/2003 | Sutliff et al. | 331/158 |
| 8,217,726 | B2 * | 7/2012 | Sako et al. | 331/59 |

* cited by examiner

*Primary Examiner* — Ryan Johnson
(74) *Attorney, Agent, or Firm* — Baker Botts L.L.P.

(57) ABSTRACT

In accordance with some embodiments of the present disclosure, an oscillator circuit comprises, a first pad associated with a first terminal of an oscillator and a second pad associated with a second terminal of the oscillator. The oscillator is configured to generate an oscillating signal and communicate the oscillating signal from the second terminal to a clock distributor coupled to the second pad. The oscillator circuit further comprises an oscillator gain element comprising an output node coupled to the first pad and an input node coupled to the second pad. The oscillator circuit also comprises a digital-to-analog converter (DAC) coupled to the first pad. The oscillator circuit additionally comprises a switching circuit coupled to the gain element. The switching circuit is configured to enable the gain element when the oscillator comprises a resonator and disable the gain element when the oscillator comprises a voltage controlled oscillating module.

20 Claims, 4 Drawing Sheets

SYSTEM AND METHOD FOR SUPPORTING DIFFERENT TYPES OF OSCILLATOR CIRCUITS

TECHNICAL FIELD

The present disclosure relates generally to oscillators, including, without limitation, a system and method for supporting different types of oscillator circuits.

BACKGROUND

Wireless communications systems are used in a variety of telecommunications systems, television, radio and other media systems, data communication networks, and other systems to convey information between remote points using wireless transmitters and wireless receivers. A transmitter is an electronic device which, usually with the aid of an antenna, propagates an electromagnetic signal such as radio, television, or other telecommunications. Transmitters often include signal amplifiers which receive a radio-frequency or other signal, amplify the signal by a predetermined gain, and communicate the amplified signal. A receiver is an electronic device which receives and processes a wireless electromagnetic signal. A transmitter and receiver may be combined into a single device called a transceiver.

Transmitters, receivers, and transceivers often include components known as oscillators. An oscillator may serve many functions in a transmitter, receiver, and/or transceiver, including generating a local oscillator signal (e.g., a clock signal) (usually in a radio-frequency range) for upconverting baseband signals onto a radio-frequency (RF) carrier and performing modulation for transmission of signals, and/or for downconverting RF signals to baseband signals and performing demodulation of received signals.

Some wireless communication device manufacturers may choose to implement one of a plurality of configurations of oscillator circuits to generate an oscillating signal. For example, a manufacturer may choose to implement a simple resonator with a gain element specifically designed to generate a clock signal having a desired clock frequency of the particular communication device, while another wireless communication device manufacturer may choose to implement a voltage controlled oscillator module configured to generate the clock signal and where the frequency may be controlled by a control voltage.

SUMMARY

In accordance with some embodiments of the present disclosure, an oscillator circuit comprises, a first pad associated with a first terminal of an oscillator and a second pad associated with a second terminal of the oscillator. The oscillator is configured to generate an oscillating signal and communicate the oscillating signal from the second terminal to a clock distributor coupled to the second pad. The oscillator circuit further comprises an oscillator gain element comprising an output node coupled to the first pad and an input node coupled to the second pad. The oscillator circuit also comprises a digital-to-analog converter (DAC) coupled to the first pad. The oscillator circuit additionally comprises a switching circuit coupled to the gain element. The switching circuit is configured to enable the gain element when the oscillator comprises a resonator and disable the gain element when the oscillator comprises a voltage controlled oscillating module.

BRIEF DESCRIPTION OF THE DRAWINGS

For a more complete understanding of the present disclosure and its features and advantages, reference is now made to the following description, taken in conjunction with the accompanying drawings, in which.

DETAILED DESCRIPTION

Figure 1:
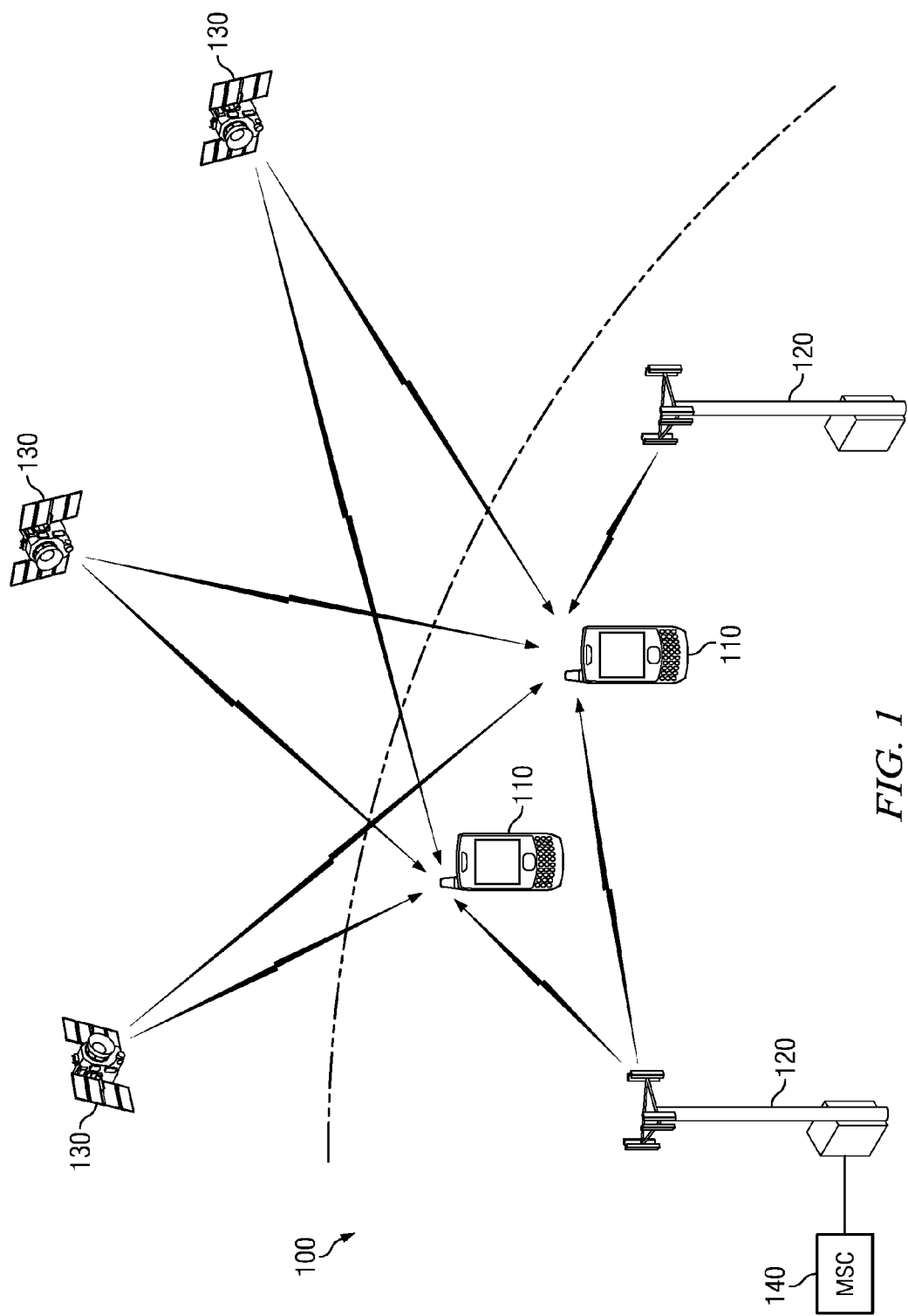
FIG. 1 illustrates a block diagram of an example wireless communication system, in accordance with certain embodiments of the present disclosure.

FIG. 1 illustrates a block diagram of an example wireless communication system 100, in accordance with certain embodiments of the present disclosure. For simplicity, only two terminals 110 and two base stations 120 are shown in FIG. 1. A terminal 110 may also be referred to as a remote station, a mobile station, an access terminal, user equipment (UE), a wireless communication device, a cellular phone, or some other terminology. A base station 120 may be a fixed station and may also be referred to as an access point, a Node B, or some other terminology. A mobile switching center (MSC) 140 may be coupled to the base stations 120 and may provide coordination and control for base stations 120.

A terminal 110 may or may not be capable of receiving signals from satellites 130. Satellites 130 may belong to a satellite positioning system such as the well-known Global Positioning System (GPS). Each GPS satellite may transmit a GPS signal encoded with information that allows GPS receivers on earth to measure the time of arrival of the GPS signal. Measurements for a sufficient number of GPS satellites may be used to accurately estimate a three-dimensional position of a GPS receiver. A terminal 110 may also be capable of receiving signals from other types of transmitting sources such as a Bluetooth transmitter, a Wireless Fidelity (Wi-Fi) transmitter, a wireless local area network (WLAN) transmitter, an IEEE 802.11 transmitter, and any other suitable transmitter.

In FIG. 1, each terminal 110 is shown as receiving signals from multiple transmitting sources simultaneously, where a transmitting source may be a base station 120 or a satellite 130. In certain embodiments, a terminal 110 may also be a transmitting source. In general, a terminal 110 may receive signals from zero, one, or multiple transmitting sources at any given moment.

System 100 may be a Code Division Multiple Access (CDMA) system, a Time Division Multiple Access (TDMA) system, or some other wireless communication system. A CDMA system may implement one or more CDMA standards such as IS-95, IS-2000 (also commonly known as "1×"), IS-856 (also commonly known as "1×EV-DO"), Wideband-CDMA (W-CDMA), and so on. A TDMA system may implement one or more TDMA standards such as Global System for Mobile Communications (GSM). The W-CDMA standard is defined by a consortium known as 3GPP, and the IS-2000 and IS-856 standards are defined by a consortium known as 3GPP2.

Figure 2:
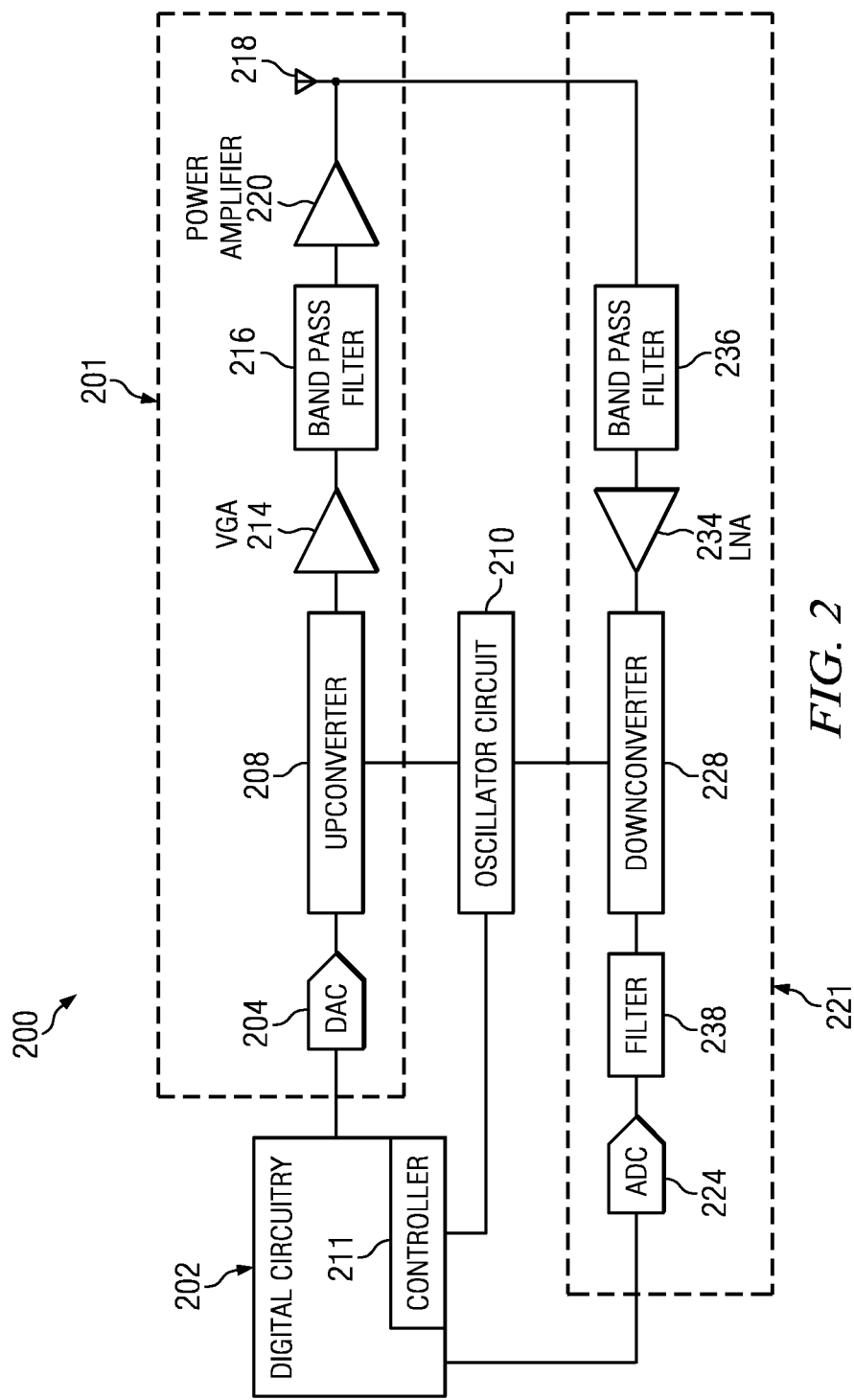
FIG. 2 illustrates a block diagram of selected components of an example transmitting and/or receiving element, in accordance with certain embodiments of the present disclosure.

FIG. 2 illustrates a block diagram of selected components of an example transmitting and/or receiving element 200 (e.g., a terminal 110, a base station 120, or a satellite 130), in accordance with certain embodiments of the present disclosure. As discussed in further detail with respect to FIG. 3, element 200 may be configured to operate with an oscillator circuit 210 (discussed further below) that may comprise a simple resonator (e.g., a crystal resonator, an inductor/capacitor (LC) resonator, a ceramic resonator or a micro-electromechanical (MEM) resonator) with a gain element specifically designed to generate a clock signal with a desired frequency for element 200. Element 200 may also be configured to disable the gain element such that pads used to interface the gain element and simple resonator with oscillator circuit 210 may be used to support configurations of oscillator circuit 210 that may not use the gain element. Element 200 may be configured such that the gain element may be disabled when not in use such that the gain element is not damaged. For example, oscillator circuit 210 may be configured to disable the gain element such that the pads used to interface the gain element with oscillator circuit 210 may be used to interface an oscillator module with oscillator circuit 210 (e.g., a voltage controlled oscillator (VCO) module configured to generate the clock signal according to a control voltage). In some instances, the VCO may comprise a voltage controlled, temperature compensated crystal oscillator (VCTCXO) module.

As further discussed below, element 200 may be configured to determine whether to enable or disable the gain element of oscillator circuit 210 depending on the configuration of element 200 an oscillator circuit 210. For example, in some embodiments, element 200 may be configured to determine upon startup whether a simple resonator is being used as an oscillator with the gain element to generate an oscillating signal or whether an oscillator module is being used to generate an oscillating signal. Element 200 may accordingly perform operations to enable or disable the gain element (among other operations) such that element 200 may be configured according to the type of oscillator being used. As described further in the present disclosure, element 200 may be configured to accomplish this task such that the same pins and pads may be used to interface the oscillator and gain element regardless of which type of configuration of oscillating circuit 210 is used. Additionally, element 200 may be configured to support different types of configurations of oscillator circuit 210 without requiring a hardware select pin for selecting between different types of devices interfaced at the pads (e.g., a simple resonator or VCO). Further, element 200 may be configured to run the same startup sequence regardless of the configuration being used.

Element 200 may include a transmit path 201 and/or a receive path 221. Depending on the functionality of element 200, element 200 may be considered a transmitter, a receiver, or a transceiver.

As depicted in FIG. 2, element 200 may include digital circuitry 202. Digital circuitry 202 may include any system, device, or apparatus configured to process digital signals and information received via receive path 221, and/or configured to process signals and information for transmission via transmit path 201. Such digital circuitry 202 may include one or more microprocessors, digital signal processors, and/or other suitable devices. In the present embodiment, digital circuitry 202 may include a controller 211. As described in further detail below, controller 211 may be operable to configure oscillator circuit 210 to operate with a simple resonator and gain element or with a voltage controlled oscillator module (e.g., VCTCXO).

Controller 211 may comprise any suitable system, apparatus or device configured to perform the operations of controller 211. In some embodiments, controller 211 may comprise any system, device, or apparatus configured to interpret and/or execute program instructions and/or process data, and may include without limitation a microprocessor, microcontroller, digital signal processor (DSP), application specific integrated circuit (ASIC), or any other digital or analog circuitry configured to interpret and/or execute program instructions and/or process data. In some embodiments, controller 211 may interpret and/or execute program instructions and/or process data stored in memory communicatively coupled to controller 211 (not expressly shown).

Memory may comprise any system, device or apparatus operable to retain program instructions or data for a period of time (e.g., computer-readable media). Memory may include random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to controller 211 is turned off.

Transmit path 201 may include a digital-to-analog converter (DAC) 204. DAC 204 may be configured to receive a digital signal from digital circuitry 202 and convert such digital signal into an analog signal. Such analog signal may then be passed to one or more other components of transmit path 201, including upconverter 208. Upconverter 208 may be configured to frequency upconvert an analog signal received from DAC 204 to a wireless communication signal at a radio frequency based on an oscillator signal provided by oscillator circuit 210.

Oscillator circuit 210 may be any suitable device, system, or apparatus configured to produce an analog waveform of a particular frequency for modulation or upconversion of an analog signal to a wireless communication signal, or for demodulation or downconversion of a wireless communication signal to an analog signal. Accordingly, oscillator circuit 210 may produce a clock signal that may be used for modulation or demodulation.

As described above, in some embodiments, oscillator circuit 210 may comprise a simple resonator with a gain element specifically designed to generate a clock signal having a desired frequency for element 200. In other embodiments, oscillator circuit 210 may comprise a different configuration that may substitute a simple resonator with a voltage controlled oscillator module (e.g., VCTCXO) configured to generate a clock signal having the desired frequency according to a received control voltage, such that the gain element may not be used. However, oscillator circuit 210 may be configured such that the simple resonator or other component (e.g., VCO) may use the same pads to interface with oscillator circuit 210. Therefore, oscillator circuit 210 may be configured to enable the gain element when the gain element is used (e.g., with a simple resonator configuration) and disable the gain element when the gain element is not used (e.g., with a VCO configuration) in such a manner to avoid potential damage to the gain element. Transmit path 201 may include a variable-gain amplifier (VGA) 214 to amplify an upconverted signal for transmission, and a bandpass filter 216 configured to receive an amplified signal VGA 214 and pass signal components in the band of interest and remove out-of-band noise and undesired signals. The bandpass filtered signal may be received by power amplifier 220 where it is amplified for transmission via antenna 218. Antenna 218 may receive the amplified and transmit such signal (e.g., to one or more of a terminal 110, a base station 120, and/or a satellite 130).

Receive path 221 may include a bandpass filter 236 configured to receive a wireless communication signal (e.g., from a terminal 110, a base station 120, and/or a satellite 130) via antenna 218. Bandpass filter 236 may pass signal components in the band of interest and remove out-of-band noise and undesired signals. In addition, receive path 221 may include a low-noise amplifier (LNA) 224 to amplify a signal received from bandpass filter 236.

Receive path 221 may also include a downconverter 228. Downconverter 228 may be configured to frequency downconvert a wireless communication signal received via antenna 218 and amplified by LNA 234 by an oscillator signal provided by oscillator 210 (e.g., downconvert to a baseband signal). Receive path 221 may further include a filter 238, which may be configured to filter a downconverted wireless communication signal in order to pass the signal components within a radio-frequency channel of interest and/or to remove noise and undesired signals that may be generated by the downconversion process. In addition, receive path 221 may include an analog-to-digital converter (ADC) 224 configured to receive an analog signal from filter 238 and convert such analog signal into a digital signal. Such digital signal may then be passed to digital circuitry 202 for processing.

Figure 3:
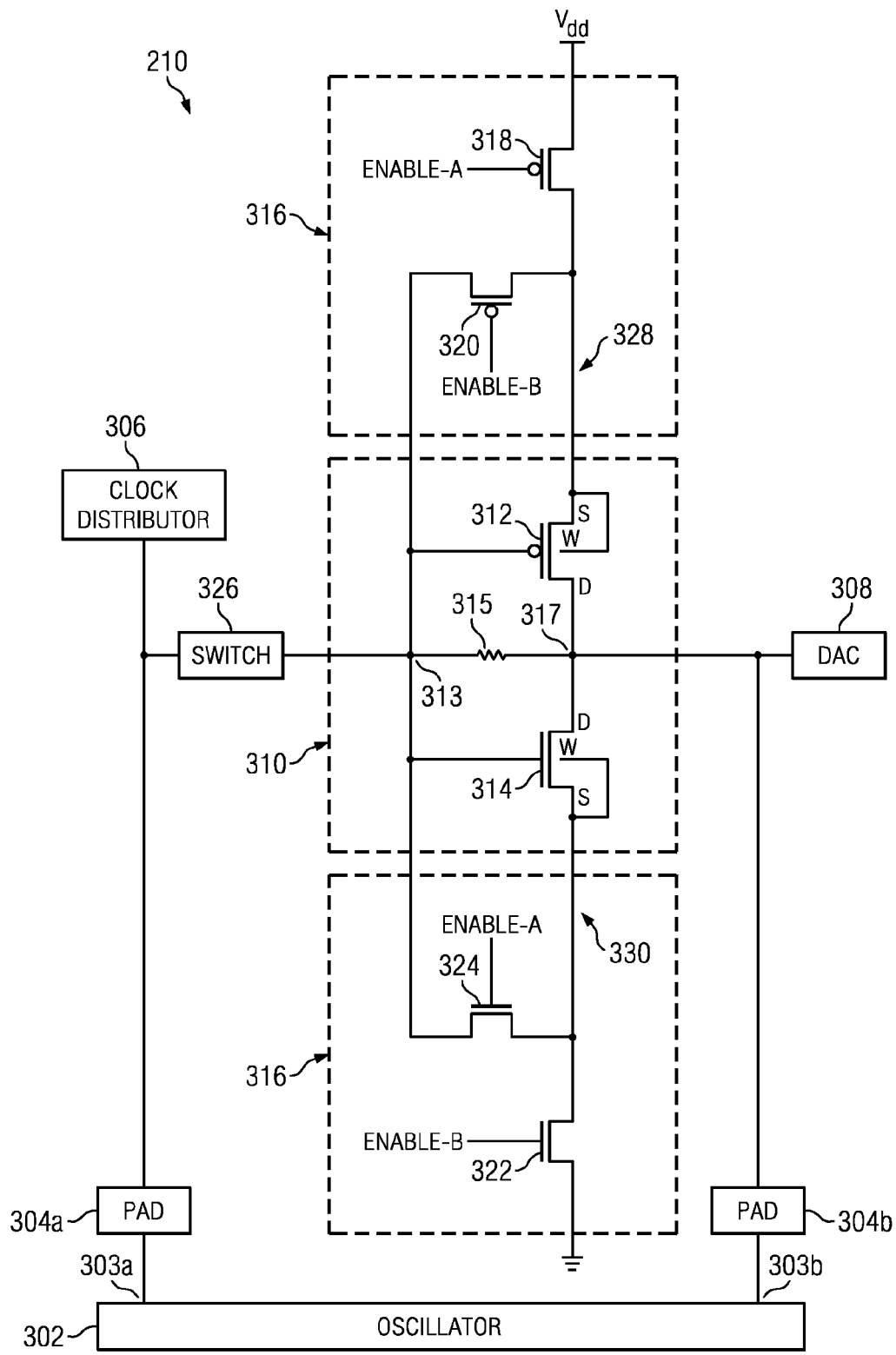
FIG. 3 illustrates an example of an oscillator circuit in accordance with certain embodiments of the present disclosure.

FIG. 3 illustrates an example of oscillator circuit 210 in accordance with certain embodiments of the present disclosure. Oscillator circuit 210 may include an oscillator 302 configured to generate a signal having a particular frequency. In some embodiments oscillator 302 may comprise a simple resonator. For example, in some embodiments, the resonator may comprise a vibrating crystal of piezoelectric material that resonates at a certain frequency and creates an electrical signal with that certain frequency. In other embodiments the resonator may comprise an inductor/capacitor (LC) resonator, or a micro-electro-mechanical (MEM) resonator. In embodiments where oscillator 302 comprises a simple resonator, a gain element 310 (described in further detail below) may be used to manipulate the frequency of oscillator 302 such that the gain element and simple resonator may generate a clock signal having the desired frequency.

In other embodiments, oscillator 302 may comprise a voltage controlled oscillator (VCO) module. A VCO may comprise any suitable component configured to generate a signal having a particular frequency according to a control voltage received by the VCO. In some embodiments the VCO may comprise a VCTCXO that may comprise any suitable component configured to generate a signal having a particular frequency according to a control voltage and that also includes one or more temperature compensating components. In embodiments where oscillator 302 comprises a VCO module, a DAC 308 (discussed in further detail below) may communicate a control signal to the VCO to manipulate the frequency of oscillator 302 such that gain element 310 may be disabled.

Oscillator circuit 210 may comprise pads 304a and 304b configured to interface with terminals 303a and 303b, respectively, of oscillator 302 such that oscillator 302 may receive and transmit signals with respect to oscillator circuit 210. Accordingly, pads 304a and 304b may be associated with pins (not shown) that allow placement of oscillator 302 such that oscillator 302 may be coupled to oscillator circuit 210 via terminals 303a and 303b. As described in further detail below, oscillator circuit 210 may be configured such that pads 304a and 304b and their corresponding pins may be used to interface oscillator 302 and gain element 310 with oscillator circuit 210 regardless of whether oscillator 302 comprises a simple resonator or a VCO module such as a VCTCXO module. Reducing the number of pads and pins may allow for reduction of the chip space of oscillator circuit 210 and may also reduce the cost of producing oscillator circuit 210.

Clock distributor 306 of oscillator circuit 210 may be coupled to pad 304a such that clock distributor 306 receives the signal (e.g., clock signal) generated by oscillator 302. Clock distributor 306 may comprise any suitable system, apparatus, or device configured to distribute the signal generated by oscillator circuit 210 to the appropriate components of element 200.

As discussed above, oscillator circuit 210 may include a gain element 310 that may be configured to manipulate the frequency of a signal generated by oscillator 302 in instances when oscillator 302 may comprise a simple resonator. In some instances gain element 310 may comprise a complementary metal-oxide-semiconductor (CMOS) digital inverter. As such, gain element 310 may include a p-type MOS transistor (pMOS) 312 and an n-type MOS transistor (nMOS) 314, where the gates of nMOS 314 and pMOS 314 are tied to input node 313 of gain element 310. Accordingly, gain element 310 may be configured such that when a "HIGH" signal (e.g., a digital "1") is received at input node 313 of gain element 310, pMOS 312 may turn off and nMOS 314 may turn on to tie output node 317 of gain element 310 to ground such that gain element 310 outputs a "LOW" signal (e.g., a digital "0") at output node 317. Further when gain element 310 receives a "LOW" signal at input node 313, nMOS 314 may turn off and pMOS 312 may turn on to tie output node 317 to the supply voltage such that gain element 310 outputs a "HIGH" signal at output node 317. Gain element 310 may also include a resistor 315 that may affect the frequency of the signal generated by oscillator 302.

Therefore, in instances when oscillator 302 comprises a simple resonator, gain element 310 may be coupled to pad 304a at input node 313 such that gain element 310 receives a signal generated by oscillator 302 and outputs an inverted version of the signal at output node 317. Output node 317 may be coupled to pad 304b such that oscillator 302 receives a feedback signal from output node 317. Due to the digital nature of gain element 310, the signal output at node 317 may approximate a square wave even if the signal received at node 313 is not necessarily a square wave (such as upon start up when the resonator associated with oscillator 302 initially generates a signal). Additionally, due to the feedback nature of gain element 310 with respect to oscillator 302, the signal leaving oscillator 302 and going to pad 304a may become a square wave and be dictated by gain element 310.

As previously mentioned, oscillator circuit 210 may also include DAC 308. DAC 308 may be coupled to terminal 303b of oscillator 302 via pad 304b. Therefore, DAC 308 may also be coupled to output node 317 of gain element 310. DAC 308 may also be coupled to controller 211 of FIG. 2 and may be configured to communicate signals to pad 304b and terminal 303b of oscillator 302 according to signals received from controller 211. In the present embodiment, DAC 308 may comprise a tri-state DAC that may be enabled or disabled according to an enabling signal received. Accordingly, DAC 308 may also be coupled to controller 211 such that controller 211 may enable or disable DAC 308 according to an enabling signal communicated to DAC 308 from controller 211.

As previously discussed, in instances when oscillator 302 comprises a voltage controlled oscillator module, such as a VCTCXO, DAC 308, instead of gain element 310, may be used to control the frequency of the signal going from terminal 303a of oscillator 302 to clock distributor 306 via pad 304a. As explained above, a voltage controlled oscillator (temperature compensated or not) may vary the frequency of the signal it generates according to a received control voltage. Accordingly, in instances when oscillator 302 comprises a type of voltage controlled oscillator module, controller 211 may enable DAC 308 to provide the control voltage at pad 304b such that oscillator 302 may generate a signal to be received by clock distributor 306 via terminal 303a and pad 304a. DAC 308 may provide the control voltage according to signals received from controller 211.

As shown in FIG. 3 and described above, to allow oscillator 302 to comprise either a simple resonator that utilizes gain element 310 or a voltage controlled oscillator module that receives control signals from DAC 308 and to utilize the same pads/pins regardless of which oscillator is being used as oscillator 302, the output of DAC 308 and output node 317 of gain element 310 may be coupled together. However, DAC 308 may be configured to transmit control signals having voltages sufficiently high to damage one or more of these components (e.g., pMOS 312 and nMOS 314) of gain element 310.

For example, to allow for switching at speeds required for the desired clock rate of element 200, pMOS 312 and nMOS 314 may be sensitive to certain voltage differences between the gates, sources, drains and wells of pMOS 312 and nMOS 314. Additionally, DAC 308 may be configured to transmit control signals having voltages higher than the voltage ratings for pMOS 312 and nMOS 314 and may thus potentially damage one or both of them. Therefore, as explained in more detail below, controller 211 may disable gain element 310 such that gain element 310 is not damaged in instances when oscillator 302 comprises a voltage controlled oscillator module that may be controlled by DAC 308. Additionally, controller 211 may disable DAC 308 in instances when oscillator 302 comprises a simple resonator such that gain element 310 is utilized and DAC 308 is not needed. Therefore, oscillator circuit 210 and controller 211 may be configured such that output node 317 and DAC 308 may both be coupled to pad 304b without DAC 308 damaging one or more components of gain element 310 when DAC 308 is enabled.

Oscillator circuit 210 may include a switch 326 coupled at one end to input node 313 of gain element 310 and coupled at the other end to the node associated with pad 304a. Switch 326 may comprise any suitable system, apparatus, or device configured to couple or decouple input node 313 to the node associated with pad 304a. Although not explicitly shown, switch 326 may be coupled to controller 211 of FIG. 2 and may open and close according to signals received from controller 211. For example, switch 326 may comprise a transmission gate (T-gate) configured to open and close according to signals sent from controller 211.

In the present example, in instances when oscillator 302 comprises a simple resonator such that gain element 310 is used, controller 211 may send a signal to switch 326 such that switch 326 closes to, thus couple input node 313 with pad 304a. Accordingly, in such instances the input of gain element 310 may be coupled to oscillator 302.

In instances when oscillator 302 comprises a voltage controlled oscillator module, controller 211 may direct switch 326 to open such that input node 313 is decoupled from pad 304a. Accordingly, in such instances the input of gain element 310 may not be coupled to oscillator 302 due to the use of oscillator 302 not being needed.

Oscillator circuit 210 may also include a switching circuit 316. Switching circuit 316 may be configured to enable gain element 310 in instances when oscillator 302 comprises a simple resonator. Switching circuit 316 may also be configured to disable gain element 310 in instances when oscillator 302 comprises a voltage controlled oscillator module configured to receive control signals from DAC 308. Switching circuit 316 may enable and disable gain element 310 according to signals received from controller 211 as discussed in further detail below.

Switching circuit 316 may include a pMOS transistor 318 with the source of pMOS 318 coupled to supply voltage Vdd and the drain of pMOS 318 coupled to the source of pMOS 312 of gain element 310 at node 328 of oscillator circuit 210. The gate of pMOS 318 may also be coupled to controller 211 of FIG. 2 (not expressly shown) such that pMOS 318 may receive a control signal "Enable-A" from controller 211. Accordingly, pMOS 318 may act as a switch that may couple and decouple gain element 310 with supply voltage Vdd according to control signal Enable-A.

For example, in instances when gain element 310 is enabled (e.g., when oscillator 302 comprises a simple resonator) controller 211 may set Enable-A "LOW" to turn pMOS 318 on such that the source of pMOS 312 of gain element 310 is coupled to supply voltage Vdd. In instances when gain element 310 is disabled (e.g., when oscillator 302 comprises a voltage controlled oscillator module) controller 211 may set Enable-A "HIGH" to turn pMOS 318 off such that the source of pMOS 312 of gain element 310 is decoupled from supply voltage Vdd.

Switching circuit 316 may include an nMOS transistor 322, with the source of nMOS 322 coupled to ground, and the drain of nMOS 322 coupled to the source of nMOS 314 of gain element 310 at node 330 of oscillator circuit 210. The gate of nMOS 322 may be coupled to controller 211 of FIG. 2 such that nMOS 322 may receive a control signal "Enable-B" from controller 211. Accordingly, similarly to pMOS 318 with respect to supply voltage Vdd, nMOS 322 may act as a switch that may couple and decouple gain element 310 with ground according to control signal Enable-B.

For example, in instances when gain element 310 is enabled (e.g., when oscillator 302 comprises a simple resonator) controller 211 may set Enable-B "HIGH" to turn nMOS 322 on such that the source of nMOS 314 of gain element 310 is coupled to ground. In instances when gain element 310 is disabled (e.g., when oscillator 302 comprises a voltage controlled oscillator module) controller 211 may set Enable-B "LOW" to turn nMOS 322 off such that the source of nMOS 314 of gain element 310 is decoupled from ground.

Switching circuit 316 may also comprise a pMOS transistor 320 coupled to the drain of pMOS 318 and the source of pMOS 312 at node 328. Further, the well of pMOS 312 may be tied to the source of pMOS 312 at node 328. PMOS 320 may also be coupled to input node 313, which may also be coupled to the gate of pMOS 312. The gate of pMOS 320 may be communicatively coupled to controller 211 of FIG. 2 (not expressly shown) and may be configured to receive control signal Enable-B from controller 211.

When controller 211 sets Enable-B "LOW," pMOS 320 may turn on and tie the source and well of pMOS 312 with the gate of pMOS 312 such that the voltage at the source, well and gate of pMOS 312 may be approximately the same and, thus, nodes 328 and 313 may also have approximately the same voltage. When controller 211 sets Enable-B "HIGH," pMOS 320 may turn off such that the source and well of pMOS 312 are not tied to the gate of pMOS 312.

As described previously, Enable-B may go "LOW" in instances when gain element 310 is disabled and Enable-B may go "HIGH" in instances when gain element 310 is enabled. Therefore, pMOS 320 may turn on to aid in disabling gain element 310 by tying the source and well of pMOS 312 with the gate of pMOS 312 to disable pMOS 312 of gain element 310. Additionally, pMOS 320 may turn off when gain element 310 is enabled such that the gate of pMOS 312 is not tied to the source and well of pMOS 312 to allow pMOS 312 to operate as desired when gain element 310 is enabled.

Switching circuit 316 may also comprise an nMOS transistor 324 configured to perform a similar function as pMOS 320. NMOS 324 may be coupled to the drain of nMOS 322 and the source of nMOS 314 at node 330. Further, the well of nMOS 314 may be tied to the source of nMOS 314. NMOS 324 may also be coupled to node 313, which may also be coupled to the gate of nMOS 314 of gain element 310. The gate of nMOS 324 may be communicatively coupled to controller 211 of FIG. 2 and may be configured to receive control signal Enable-A from controller 211.

When controller 211 sets Enable-A "HIGH," nMOS 324 may turn on and tie the source and well of nMOS 314 with the gate of nMOS 314 such that the voltage at the source, well and gate of nMOS 314 may be approximately the same and, thus, nodes 330 and 313 may have approximately the same voltage. When controller 211 sets Enable-A "LOW," nMOS 324 may turn off such that the source and well of nMOS 314 are not tied to the gate of nMOS 314.

As described previously, Enable-A may go "HIGH" in instances when gain element 310 is disabled and Enable-A may go "LOW" in instances when gain element 310 is enabled. Therefore, nMOS 324 may turn on to aid in disabling gain element 310 by tying the source and well of nMOS 314 with the gate of nMOS 314 to disable nMOS 314 of gain element 310. Additionally, nMOS 324 may turn off when gain element 310 is enabled such that the gate of nMOS 314 is not tied to the source and well of nMOS 314 to allow nMOS 314 to operate as desired when gain element 310 is enabled.

Therefore, as explained above, in instances when gain element 310 is disabled and DAC 308 is enabled (e.g., when oscillator 302 comprises a voltage controlled oscillator module), Controller 211 may set control signal Enable-A "HIGH" and control signal Enable-B "LOW." With Enable-A "HIGH" and Enable-B "LOW," pMOS 318 may turn off to decouple node 328 of gain element 310 from supply voltage Vdd; pMOS 320 may turn on to tie the source, well and gate of pMOS 312 and, thus, couple node 328 with node 313; nMOS 324 may turn on to tie the source, well and gate of nMOS 314 and, thus, couple node 330 with node 313 (and consequently node 328 also, due to pMOS 320 also being on); and nMOS 322 may turn off to decouple node 330 of gain element 310 from ground. Additionally, when gain element 310 is disabled, switch 326 may open such that input node 313 of gain element 310 is decoupled from pad 304a such that the voltage at pad 304a may not substantially affect the voltage at node 313. Additionally, in such an instance (due to switch 326 being open), little to no current may flow through resistor 315 such that the voltage at node 313 may be substantially equal to the voltage at node 317, which may be governed by the voltage of DAC 308.

Accordingly, when gain element 310 is disabled, nodes 328, 313, 330 and 317 may essentially constitute the same node that ties the gates, wells, sources and drains of pMOS 312 and nMOS 314 together, such that the voltage at the drains, sources, wells and gates of pMOS 312 and nMOS 314 may be substantially the same as the voltage of the output of DAC 308. As mentioned above, the damage that high voltage levels may cause to pMOS 312 and nMOS 314 may be related to the voltage difference between the gates, drains, sources and wells of pMOS 312 and nMOS 314. Therefore, by tying the gates, sources, drains and wells of pMOS 312 and nMOS 314 to each other, the voltage at the gates, drains, sources and wells of pMOS 312 and nMOS 314 may be substantially the same such that the voltage difference between the gates, drains, sources and wells may be reduced or eliminated. Accordingly, pMOS 312 and nMOS 314 may not be damaged when the voltage of DAC 308 reaches a level that may otherwise damage pMOS 312 and nMOS 314 if the sources, drains, wells and gates were not tied together. Further, pMOS 318, pMOS 320, nMOS 324 and nMOS 322 may be configured to have a higher voltage difference tolerance than pMOS 312 and nMOS 314 such that the higher voltages of DAC 308 may not adversely affect pMOS 318, pMOS 320, nMOS 324 and nMOS 322.

Moreover, as described above, in instances when gain element 310 is enabled, controller 211 may set control signal Enable-A "LOW" and control signal Enable-B "HIGH." With Enable-A "LOW" and Enable-B "HIGH," pMOS 318 may turn on such that node 328 (and consequently the source and well of pMOS 312) of gain element 310 are coupled to supply voltage Vdd; pMOS 320 may turn off such that the gate of pMOS 312 is not tied with the well and source of pMOS 312 to allow for the switching operation of pMOS 312; nMOS 324 may also turn off such that the gate of nMOS 314 is not tied with the well and source of nMOS 314 to allow for the switching operation of nMOS 314; and nMOS 322 may turn on such that node 316 (and consequently the source and well of nMOS 314) is coupled to ground. Additionally, when gain element 310 is enabled, controller 211 may close switch 326 to allow input node 313 to receive signals from pad 304a. Further, controller 211 may disable DAC 308 such that DAC 308 may not produce a voltage that may damage gain element 310.

Therefore, oscillator circuit 210 may be configured such that DAC 308 and a node of gain element 310 (e.g., output node 317) may be coupled to the same pad/pin (e.g., pad 304b and its associated pin) associated with an oscillator (e.g., oscillator 302). Further, oscillator circuit 210 may be configured such that another pad (e.g., pad 304a) associated with the oscillator and coupled to a clock distributor (e.g., clock distributor 306) may be used regardless of whether the oscillator comprises a simple resonator or a voltage controlled oscillator module, such that another pad/pin may not be necessary. Additionally, oscillator circuit 210 may be configured such that a select pin associated with switching between a DAC and a gain element may be unnecessary. Further, as described in greater detail in FIG. 4, oscillator circuit 210 may be configured to have the same startup sequence regardless of whether oscillator 302 comprises a simple resonator or a voltage controlled oscillator module. Therefore, oscillator circuit 211 may be configured to allow the choice between utilizing a voltage controlled oscillator module or a simple resonator without increasing the number of pins, which may decrease the size and cost of producing oscillator circuit 211.

Modifications, additions, or omissions may be made to FIGS. 2 and 3 without departing from the scope of the present disclosure. For example, element 200 and oscillator circuit 210 may include more or fewer components than those depicted. Additionally, although certain elements are described as performing certain functions, it is understood that any suitable component configured to perform the same or similar functions may be used. Further, to facilitate the description, oscillator circuit 210 is described as enabling and disabling gain element 310 with respect to oscillator 302 comprising a simple resonator or a voltage controlled oscillator module (VCO). However, it is understood that the present disclosure is not limited to such and that oscillator circuit 210 may enable and disable gain element 310 according to the present disclosure in response to a wide variety of possible configurations of oscillator circuit 210. For example, an external oscillator may be used to generate the oscillating signal of element 200 such that gain element 310 may not be used and such that pad 304b may be used as a general purpose input/output pad. In such instances, pad 304b that may be used for a plurality of purposes such as, but not limited to, an analog output, an analog input, a digital input, a digital output, etc.) and gain element 310 may be disabled according to the present description.

Figure 4:
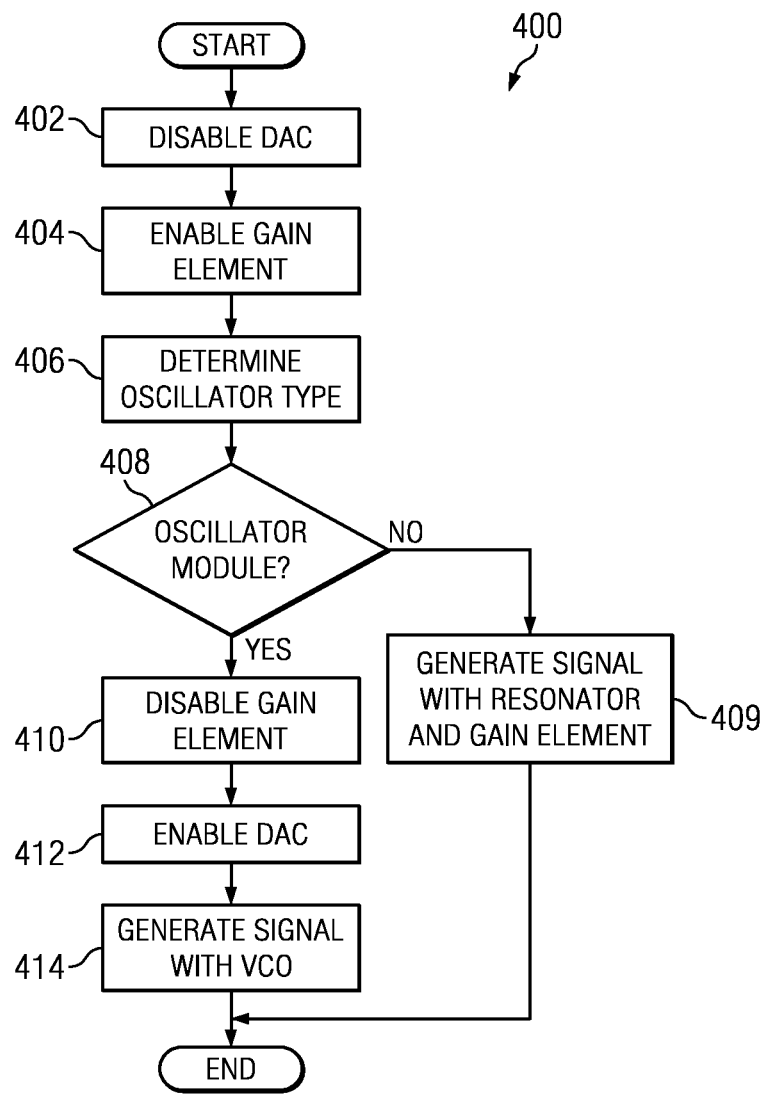
FIG. 4 illustrates an example method for starting up an oscillator circuit, in accordance with certain embodiments of the present disclosure.

FIG. 4 illustrates an example method 400 for starting up an oscillator circuit, in accordance with various embodiments of the present disclosure. Method 400 may be performed by any suitable, system, apparatus or device configured to perform one or more of the steps of method 400. In the present example method 400 may be performed by one or more components of element 200 such as oscillator circuit 210 and controller 211; however any suitable components other than those specifically listed may perform the operations described herein.

Method 400 may start and at step 402, DAC 308 may receive a signal from controller 211 that disables DAC 308 and at step 404, with DAC 308 disabled, controller 211 may enable gain element 310. As described above, controller 211 may enable gain element 310 by setting control signal Enable-A "LOW" and by setting control signal Enable-B "HIGH." Additionally, controller 211 may communicate a signal to switch 326 to close switch 326 such that input node 313 of gain element 310 may be receiving signals from oscillator 302 via pad 304a.

At step 406, controller 211 may determine the type of oscillator of oscillator 302 and at step 408 controller 211 may determine whether oscillator 302 comprises a simple oscillator resonator that utilizes gain element 310, or a voltage controlled oscillator (e.g., a VCTCXO) module that may receive control signals from DAC 308. In some embodiments, the software or firmware of controller 211 may be programmed upon placement of oscillator 302 according to the type of oscillator used for oscillator 302, such that controller 211 may determine the type of oscillator. If oscillator 302 comprises a voltage controlled oscillator module, method 400 may proceed to step 410. If oscillator 302 comprises a simple resonator, method 400 may proceed to step 409. At step 409, the resonator of oscillator 302 and gain element 310 may generate a clock signal having the desired frequency and following step 409, method 400 may end.

At step 410, when oscillator 302 may comprise a voltage controlled oscillator module, controller 211 may disable gain element 310. As described above with respect to FIG. 3, controller 211 may disable gain element 310 by setting control signal Enable-A "HIGH" and by setting Enable-B "LOW." Additionally, controller 211 may disable gain element 310 by opening switch 326 to decouple input node 313 from pad 304a.

At step 412, controller 412 may enable DAC 308 such that DAC 308 may send control signals to oscillator 302 (e.g., the voltage controlled oscillator module) and at step 414 the VCO module of oscillator 302 may generate a clock signal accordingly. Following step 414, method 400 may end.

Modifications, additions or omissions may be made to method 400 without departing from the scope of the present disclosure. For example, some of the described steps may be divided into more than one step, and in the same or alternative embodiments, some of the steps may be combined into a single step. Moreover, although the steps have been described in a particular order, it is understood that one or more steps may be performed in a different order or at the same time. Additionally, although specific components have been described as performing specific steps of method 400, it is understood that any suitable components configured to perform one or more steps of method 400 may be used.

Further, to facilitate the description, method 400 is described as enabling and disabling gain element 310 with respect to oscillator 302 of FIG. 3 comprising a simple resonator or a voltage controlled oscillator module (VCO). However it is understood that the present disclosure is not limited to such and that method 400 may be used to configure oscillator circuit 210 to enable and disable gain element 310 according to the present disclosure in response to a wide variety of possible configurations of oscillator circuit 210. For example, an external oscillator may be used to generate the oscillating signal of element 200 such that gain element 310 may not be used and such that pad 304b may be used as a general purpose input/output pad. In such instances, method 400 may be used to configure oscillator circuit 210 such that gain element 210 may be disabled to facilitate the general use of pad 304b.

Although the present disclosure has been described with several embodiments, various changes and modifications may be suggested to one skilled in the art. It is intended that the present disclosure encompass such changes and modifications as fall within the scope of the appended claims.

What is claimed is:

1. An oscillator circuit comprising:
a first pad associated with a first terminal of an oscillator;
a second pad associated with a second terminal of the oscillator, the oscillator configured generate an oscillating signal and communicate the oscillating signal from the second terminal to a clock distributor coupled to the second pad;
an oscillator gain element comprising an output node coupled to the first pad and an input node coupled to the second pad, the gain element configured to control a frequency of the oscillating signal generated by the oscillator when the oscillator comprises a resonator;
a digital-to-analog converter (DAC) coupled to the first pad and configured to control the frequency of the oscillating signal when the oscillator comprises a voltage controlled oscillator module; and
a switching circuit coupled to the gain element and configured to:
enable the gain element when the oscillator comprises a resonator; and
disable the gain element when the oscillator comprises a voltage controlled oscillating module.

2. The oscillator circuit of claim 1, the switching circuit further comprising a switch coupled between the second pad and the input node of the gain element, the switch configured to:
couple the input node of the gain element with the second pad when the oscillator comprises a resonator; and
decouple the input node of the gain element from the second pad when the oscillator comprises a voltage controlled oscillator module.

3. The oscillator circuit of claim 2, wherein the switch comprises a transmission gate.

4. The oscillator circuit of claim 1, the gain element further comprising a first transistor and a second transistor each coupled to the input node of the gain element and the output node of the gain element, wherein disabling the gain element comprises tying a first gate of the first transistor, a first source of the first transistor, a first drain of the first transistor, a first well of the first transistor, a second gate of the second transistor, a second source of the second transistor, a second well of the second transistor and a second drain of the second transistor such that a voltage at the first and second gates, the first and second sources, the first and second wells and the first and second drains is approximately the same.

5. The oscillator circuit of claim 1, the DAC further configured to:
receive an enabling signal from a controller to enable the DAC when the oscillator comprises a voltage controlled oscillator module; and receive a disabling signal from the controller to disable the DAC when the oscillator comprises a resonator.

6. The oscillator circuit of claim 1, the switching circuit further configured to receive a control signal from a controller and enable and disable the gain element according to the received control signal.

7. The oscillator circuit of claim 1, the DAC further configured to communicate a control voltage to the second pad, wherein the frequency of the oscillating signal is based on the control voltage when the oscillator comprises a voltage controlled oscillator module.

8. A wireless communication element, comprising:
a receive path configured to receive a first wireless communication signal and convert the first wireless communication signal into a first digital signal based at least on an oscillator signal; and
a transmit path configured to convert a second digital signal into a second wireless communication signal based at least on the oscillator signal and transmit the second wireless communication signal;
a controller; and
an oscillator circuit communicatively coupled to the controller and comprising:
a first pad associated with a first terminal of an oscillator;
a second pad associated with a second terminal of the oscillator, the oscillator configured to generate an oscillating signal and communicate the oscillating signal from the second terminal to a clock distributor coupled to the second pad;
an oscillator gain element comprising an output node coupled to the first pad and an input node coupled to the second pad, the gain element configured to control a frequency of the oscillating signal generated by the oscillator when the oscillator comprises a resonator;
a digital-to-analog converter (DAC) coupled to the first pad and configured to control the frequency of the oscillating signal when the oscillator comprises a voltage controlled oscillator module; and
a switching circuit coupled to the gain element and configured to:
enable the gain element in response to a first control signal received from the controller when the oscillator comprises a resonator; and
disable the gain element in response to a second control signal received from the controller when the oscillator comprises a voltage controlled oscillating module.

9. The wireless communication element of claim 8, the switching circuit further comprising a switch coupled between the second pad and the input node of the gain element, the switch configured to:
couple the input node of the gain element with the second pad when the oscillator comprises a resonator; and
decouple the input node of the gain element from the second pad when the oscillator comprises a voltage controlled oscillator module.

10. The wireless communication element of claim 9, wherein the switch comprises a transmission gate.

11. The wireless communication element of claim 8, the gain element further comprising a first transistor and a second transistor each coupled to the input node of the gain element and the output node of the gain element, wherein disabling the gain element comprises tying a first gate of the first transistor, a first source of the first transistor, a first well of the first transistor, a first drain of the first transistor, a second gate of the second transistor, a second source of the second transistor, a second well of the second transistor and a second drain of the second transistor such that a voltage at the first and second gates, the first and second sources, the first and second wells and the first and second drains is approximately the same.

12. The wireless communication element of claim 8, the DAC further configured to:
receive an enabling signal from a controller to enable the DAC when the oscillator comprises a voltage controlled oscillator module; and
receive a disabling signal from the controller to disable the DAC when the oscillator comprises a resonator.

13. The wireless communication element of claim 8, the switching circuit further configured to receive a control signal from a controller and enable and disable the gain element according to the received control signal.

14. The wireless communication element of claim 8, the DAC further configured to communicate a control voltage to the second pad, wherein the frequency of the oscillating signal is based on the control voltage when the oscillator comprises a voltage controlled oscillator module.

15. A method for configuring an oscillator circuit comprising:
enabling a gain element of an oscillator circuit when an oscillator of the oscillator circuit comprises a resonator, the gain element including:
an output node coupled to a first pad of the oscillator circuit, the first pad coupled to a first terminal of the oscillator; and
an input node coupled to a second pad of the oscillator circuit, the second pad coupled to a second terminal of the oscillator;
disabling the gain element when the oscillator comprises a voltage controlled oscillator module;
enabling a digital-to-analog converter (DAC) coupled to the first pad when the oscillator comprises a voltage controlled oscillator module; and
disabling the DAC when the oscillator comprises a resonator.

16. The method of claim 15, further comprising:
disabling the DAC in response to initialization of the oscillator circuit;
enabling the gain element in response to initialization of the oscillator circuit;
determining whether the oscillator comprises a voltage controlled oscillator module or a resonator; and
enabling the DAC and disabling the gain element in response to determining that the oscillator comprises a voltage controlled oscillator module; and
maintaining disabling the DAC and enabling the gain element in response to determining that the oscillator comprises a resonator.

17. The method of claim 15, further comprising:
coupling the input node of the gain element with the second pad when the oscillator comprises a resonator; and
decoupling the input node of the gain element from the second pad when the oscillator comprises a voltage controlled oscillator module.

18. The method of claim 15, the gain element further comprising a first transistor and a second transistor each coupled to the input node of the gain element and the output node of the gain element, wherein disabling the gain element comprises tying a first gate of the first transistor, a first source of the first transistor, a first well of the first transistor, a first drain of the first transistor, a second gate of the second transistor, a second source of the second transistor, a second well of the second transistor and a second drain of the second transistor such that a voltage at the first and second gates, the first and second sources, the first and second wells and the first and second drains is approximately the same.

19. The method of claim 15, further comprising enabling and disabling the DAC according to a signal received from a controller.

20. The method of claim 15, further comprising enabling and disabling the gain element according to a control signal received from a controller.

\* \* \* \* \*